US008179696B2

(12) United States Patent
Coomer et al.

(10) Patent No.: US 8,179,696 B2
(45) Date of Patent: May 15, 2012

(54) ELECTRICAL SWITCHING APPARATUS AND MOUNTING ASSEMBLY THEREFOR

(75) Inventors: Jarrod Lyle Coomer, Weaveville, NC (US); David Aaron Metcalf, Black Mountain, NC (US)

(73) Assignee: Eaton Corporation, Cleveland, OH (US)

( * ) Notice: Subject to any disclaimer, the term of this patent is extended or adjusted under 35 U.S.C. 154(b) by 306 days.

(21) Appl. No.: 12/689,087

(22) Filed: Jan. 18, 2010

(65) Prior Publication Data

US 2011/0176287 A1 Jul. 21, 2011

(51) Int. Cl.
*H05K 7/00* (2006.01)

(52) U.S. Cl. ......................... 361/819; 361/801; 361/755

(58) Field of Classification Search .............. 361/1, 115, 361/54, 56, 93.1, 103, 601, 603, 606, 607, 361/608, 819, 715, 755, 801–803, 728; 335/20, 335/14, 2, 6, 202; 218/84; 307/43
See application file for complete search history.

(56) References Cited

U.S. PATENT DOCUMENTS

| | | | | |
|---|---|---|---|---|
| 5,224,016 | A * | 6/1993 | Weisman et al. | 361/728 |
| 6,031,195 | A * | 2/2000 | Meili et al. | 200/318 |
| 6,266,248 | B1 * | 7/2001 | Hanas et al. | 361/752 |
| 6,285,564 | B1 * | 9/2001 | O'Brien | 361/801 |
| 6,683,789 | B1 * | 1/2004 | Sheynis et al. | 361/752 |
| 6,777,627 | B1 | 8/2004 | Stevenson | |
| 7,019,229 | B1 | 3/2006 | Weister et al. | |
| 7,019,230 | B1 | 3/2006 | Vaill et al. | |
| 7,064,641 | B2 * | 6/2006 | Rowe et al. | 335/202 |
| 7,132,601 | B1 | 11/2006 | Seff | |
| 7,485,817 | B2 | 2/2009 | Gottschalk | |
| 7,558,052 | B1 | 7/2009 | Coomer et al. | |
| 7,696,447 | B2 * | 4/2010 | Chen et al. | 200/400 |

OTHER PUBLICATIONS

"Safe-T-Rack Remote Racking System", Dec. 22, 2009, pp. 1-3, Remote Solutions, LLC, http://www.safe-t-rack.com/.

* cited by examiner

*Primary Examiner* — Hung S Bui
(74) *Attorney, Agent, or Firm* — John A. Kastelic; Martin J. Moran

(57) ABSTRACT

A mounting assembly is provided for an electrical switching apparatus, such as a circuit breaker. The circuit breaker includes a housing having an exterior and an interior, separable contacts disposed in the interior, and an operating mechanism structured to open and closed the separable contacts. The exterior of the housing includes a recess. The mounting assembly includes a bracket assembly having at least one bracket, an expansion member coupled to a corresponding one of the at least one bracket and being disposed within the recess on the exterior of the housing, and an actuator movably coupled to the expansion member. The actuator is movable between an actuated position corresponding to the expansion member expanding outwardly within the recess to secure the mounting assembly to the circuit breaker, and an unactuated position corresponding to the expansion member not being expanded and the mounting assembly being removable from the circuit breaker.

18 Claims, 4 Drawing Sheets

ELECTRICAL SWITCHING APPARATUS AND MOUNTING ASSEMBLY THEREFOR

BACKGROUND

1. Field

The disclosed concept relates generally to electrical switching apparatus and, more particularly, to electrical switching apparatus, such as circuit breakers. The disclosed concept also relates to mounting assemblies for circuit breakers.

2. Background Information

Electrical switching apparatus used in power distribution systems are often mounted within a switchgear enclosure either individually or in combination with other switchgear (e.g., without limitation, circuit switching devices and circuit interrupters such as circuit breakers, contactors, motor starters, motor controllers and other load controllers).

Some electrical switching apparatus such as, for example, some medium-voltage and low-voltage circuit breakers, can be relatively large. In order to facilitate movement (e.g., installation; removal; maintenance), some circuit breakers are commonly coupled to draw-out mechanisms which permit such circuit breakers to be drawn out of the switchgear enclosure. Accordingly, such circuit breakers are commonly known in the art as "draw-out" circuit breakers. The circuit breaker may be further supported within a draw-out frame, commonly known in the art as a cassette or chassis. The switchgear enclosure generally includes a number of cells, with each cell being structured to receive a corresponding circuit breaker, and a number of closeable doors for enclosing the circuit breaker(s) within the enclosure. The draw-out mechanism includes, for example, a combination of rails and rollers coupled to one or the other, or both, of the sidewalls of the cell and the sides of the corresponding circuit breaker, which is to be drawn into and out of the cell. Draw-out circuit breakers are described in further detail, for example, in commonly assigned U.S. Pat. No. 7,019,229, which is hereby incorporated herein by reference.

To prevent injury (e.g., electrical shock), it is often desirable to limit access to energized electrical equipment within the enclosure. For example, in order to perform maintenance on a draw-out circuit breaker, the interior of the circuit breaker must be accessed, for example, by drawing the circuit breaker out of the enclosure. Improper maintenance procedures (e.g., failure to first de-energize or turn the circuit breaker OFF) could cause serious injury to maintenance personnel and damage to the electrical equipment. Accordingly, a variety of remotely operated devices such as, for example and without limitation, remotely operated racking devices and circuit breaker controls, have been developed as a safety measure for protecting personnel who work on or near energized electrical equipment. However, among other disadvantages, known devices of this type require modification of the existing switchgear enclosure, circuit breaker or electrical equipment, are mounted on the door or cover of the enclosure or circuit breaker by a relatively complex mounting hardware assembly, and/or require the door or cover to be opened potentially subjecting the operator to danger.

There is, therefore, room for improvement in electrical switching apparatus, such as circuit breakers, and in mounting assemblies therefor.

SUMMARY

These needs and others are met by embodiments of the disclosed concept, which are directed to a mounting assembly for electrical switching apparatus, such as circuit breakers. Among other benefits, the mounting assembly enables the installation (e.g., mounting) of equipment such as, for example and without limitation, remote operating apparatus, by providing access to the circuit breaker without requiring the circuit breaker cover or switchgear enclosure to be opened, and without requiring modification to the existing switchgear enclosure, circuit breaker or other electrical equipment.

As one aspect of the disclosed concept, a mounting assembly is provided for an electrical switching apparatus. The electrical switching apparatus includes a housing having an exterior and an interior, separable contacts disposed in the interior, and an operating mechanism structured to open and closed the separable contacts. The exterior of the housing includes a recess. The mounting assembly comprises: a bracket assembly including at least one bracket; an expansion member coupled to a corresponding one of the at least one bracket and being structured to be disposed within the recess on the exterior of the housing; and an actuator movably coupled to the expansion member, the actuator being movable between an actuated position corresponding to the expansion member being structured to expand outwardly within the recess to secure the mounting assembly to the electrical switching apparatus, and an unactuated position corresponding to the expansion member not being expanded and the mounting assembly being removable from the electrical switching apparatus.

The at least one bracket may comprise a retaining plate, wherein the retaining plate includes a first side structured to face the exterior of the housing, and a second side disposed opposite the first side. The expansion member may comprise a resilient element, and the actuator may comprise a lever assembly, a number of generally planar members, and a number of fasteners fastening the resilient element and the generally planar members to the lever assembly. The lever assembly may be substantially disposed on the second side of the retaining plate, and the resilient element may be disposed between a corresponding one of the generally planar members and the first side of the retaining plate. The lever assembly may include a handle, wherein the handle is movable between a first position corresponding to the actuator being disposed in the unactuated position, and a second position corresponding to the actuator being disposed in the actuated position. When the handle is moved from the first position toward the second position, the corresponding one of the generally planar members may move toward the first side of the retaining plate, thereby compressing the resilient element therebetween and causing the resilient element to expand outwardly.

The bracket assembly may further comprise an accessory housing structured to mount an accessory in a predetermined position with respect to the electrical switching apparatus. The housing of the electrical switching apparatus may further comprise a cover, and the electrical switching apparatus may further comprise a remote operating apparatus. The accessory housing may mount a number of components for the remote operating apparatus in a predetermined position with respect to the electrical switching apparatus to enable the remote operating apparatus to operate the electrical switching apparatus remotely, without requiring the cover of the electrical switching apparatus to be opened.

As another aspect of the disclosed concept, an electrical switching apparatus comprises: a housing having an exterior and an interior, the exterior of the housing comprising a recess; separable contacts disposed in the interior; an operating mechanism structured to open and closed the separable contacts; and a mounting assembly comprising: a bracket assembly including at least one bracket, an expansion member coupled to a corresponding one of the at least one bracket, the expansion member being disposed within the recess on the exterior of the housing, and an actuator movably coupled to the expansion member, the actuator being movable between an actuated position corresponding to the expansion member being expanded outwardly within the recess to secure the mounting assembly to the electrical switching apparatus, and an unactuated position corresponding to the expansion member not being expanded and the mounting assembly being removable from the electrical switching apparatus.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
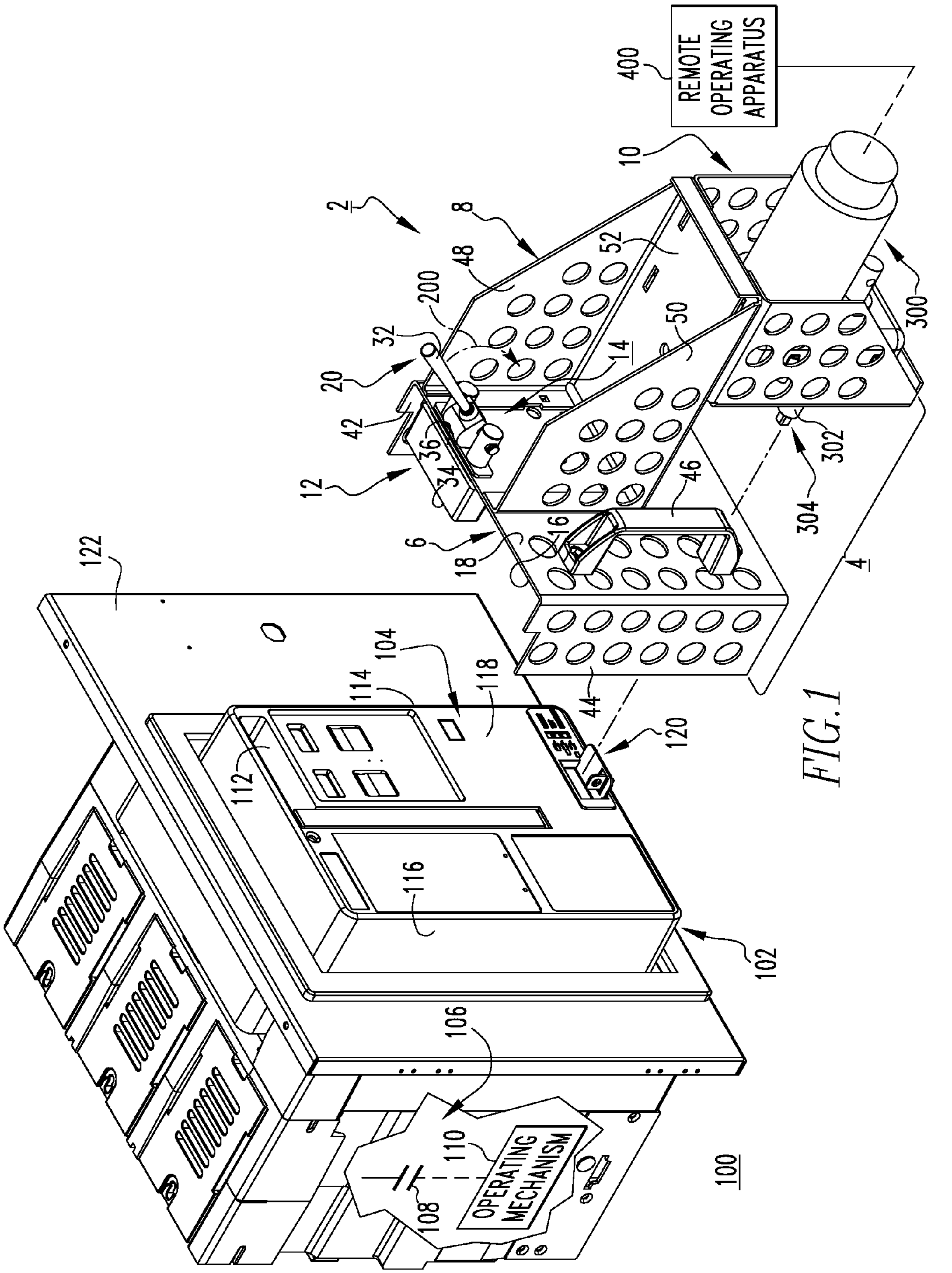
FIG. 1 is an isometric view of a mounting assembly for an electrical switching apparatus, in accordance with an embodiment of the disclosed concept.

Directional phrases used herein, such as, for example, front, back, top, bottom and derivatives thereof, relate to the orientation of the elements shown in the drawings and are not limiting upon the claims unless expressly recited therein.

As employed herein, the term “fastener” refers to any suitable connecting or tightening mechanism expressly including, but not limited to, screws, bolts and the combinations of bolts and nuts (e.g., without limitation, lock nuts) and bolts, washers and nuts.

As employed herein, the statement that two or more parts are “coupled” together shall mean that the parts are joined together either directly or joined through one or more intermediate parts.

As employed herein, the term “number” shall mean one or an integer greater than one (i.e., a plurality).

FIG. 1 shows a mounting assembly 2 for an electrical switching apparatus such as, for example and without limitation, a circuit breaker 100. In the example shown and described herein, the circuit breaker 100 includes a housing 102 having an exterior 104 and an interior 106. Separable contacts 108, which are shown in simplified form in FIG. 1, are disposed in the interior 106, and an operating mechanism 110, also shown in simplified form in FIG. 1, is structured to open and close the separable contacts 108. As will be described in greater detail hereinbelow, the exterior 104 of the circuit breaker housing 102 includes a recess 112 with which the aforementioned mounting assembly 2 is structured to cooperate.

Figure 2:
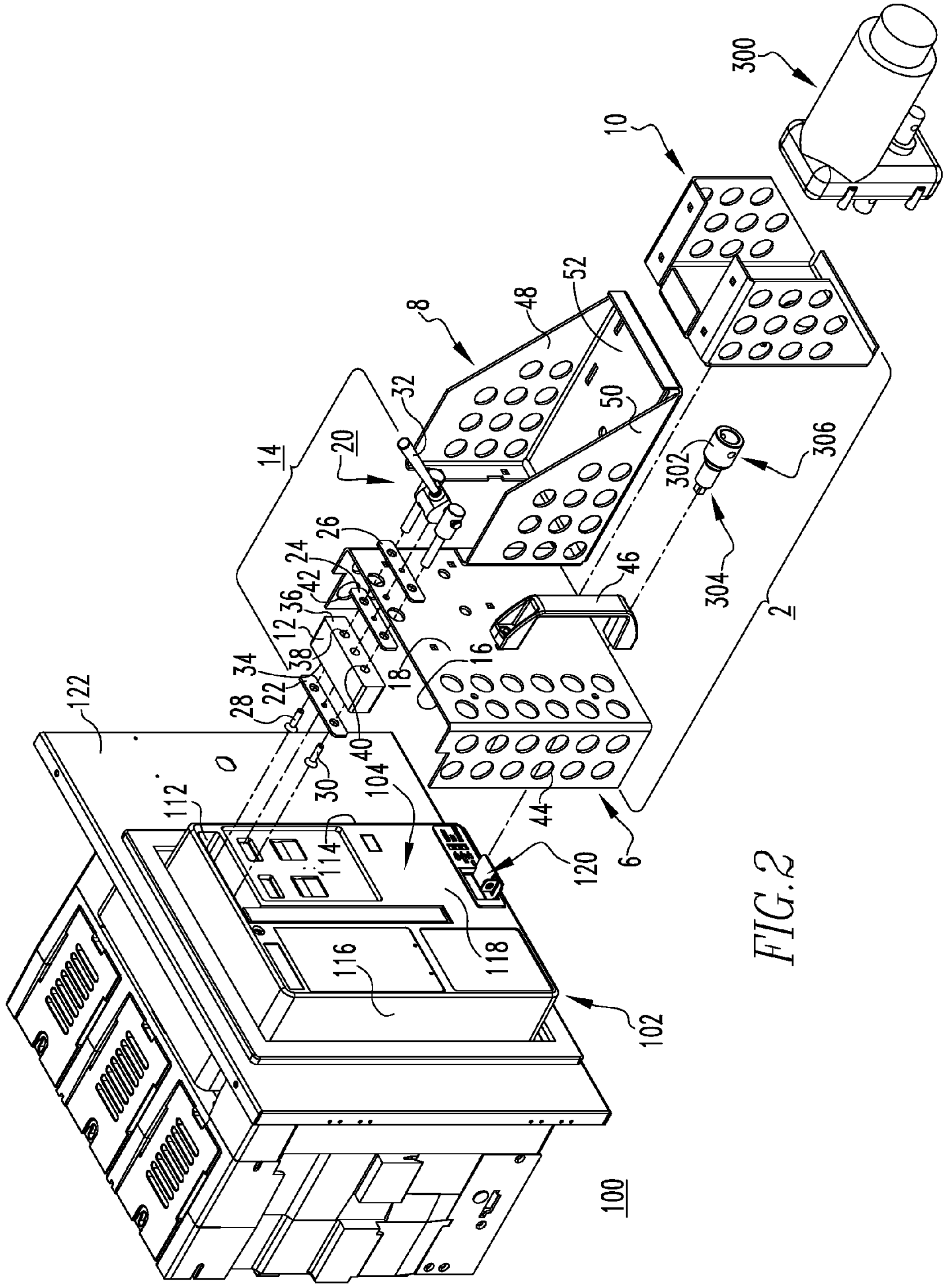
FIG. 2 is an exploded isometric view of the mounting assembly of FIG. 1.
Figure 3:
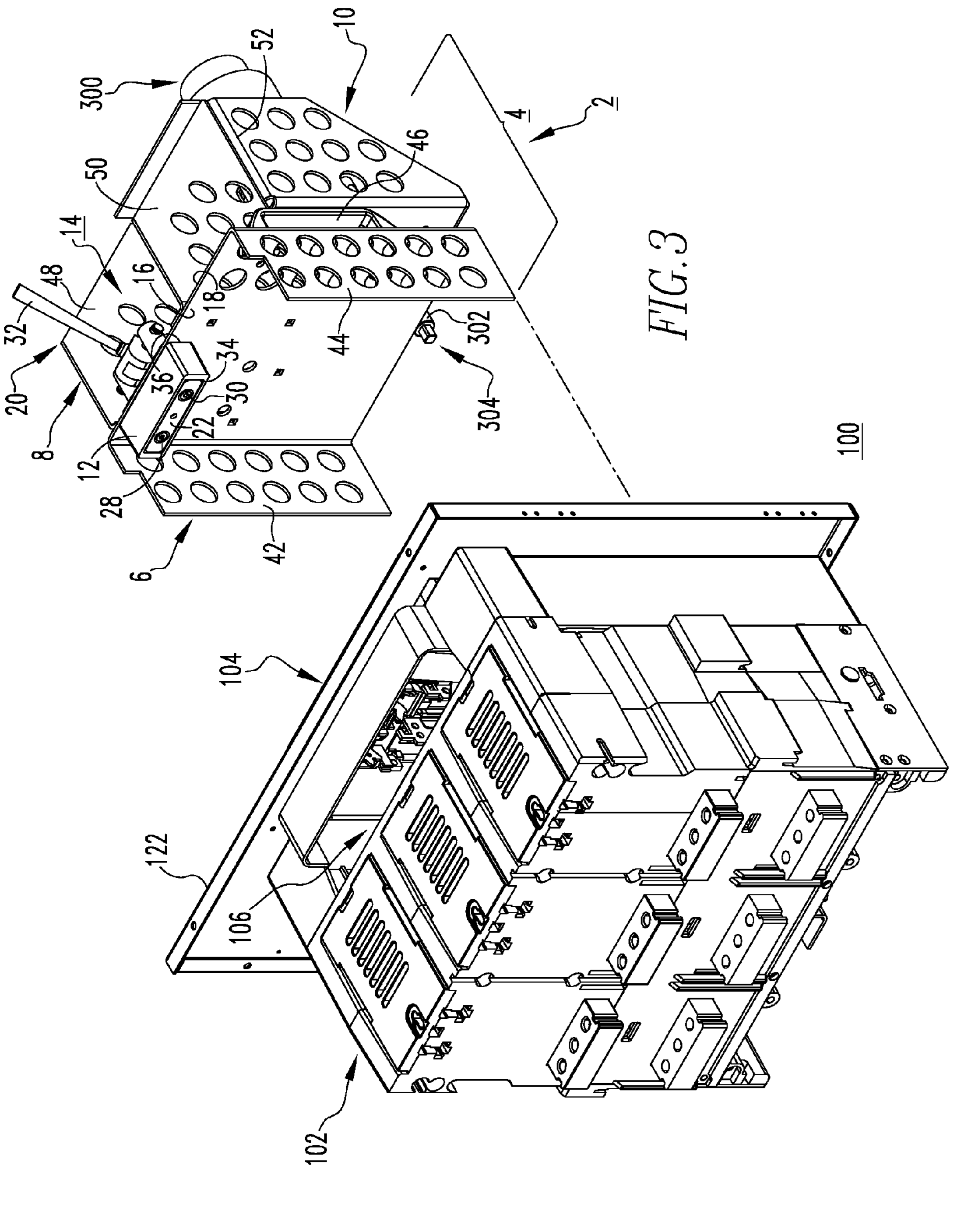
FIG. 3 is a back isometric view of the mounting assembly of FIG. 2.
Figure 4:
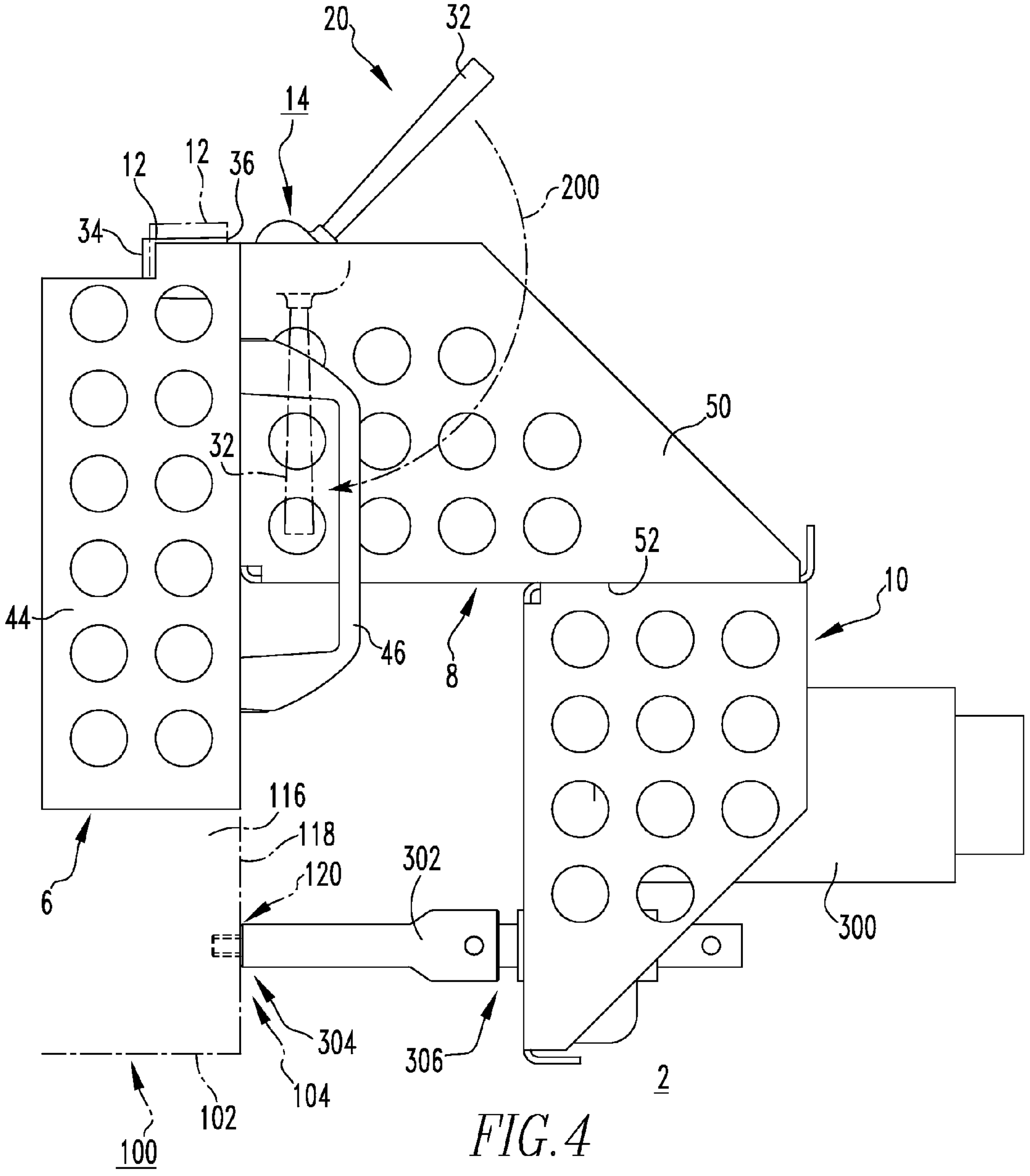
FIG. 4 is a side elevation view of the mounting assembly of FIG. 3, also showing a portion of an electrical switching apparatus in phantom line drawing.

Continuing to refer to FIG. 1, and also to FIGS. 2-4, it will be appreciated that the example mounting assembly 2 includes a bracket assembly 4 having at least one bracket 6,8,10 (three are shown). An expansion member 12 is coupled to a corresponding one of the brackets 6, and is structured to be disposed within the aforementioned recess 112 on the exterior 104 of the housing 102. An actuator 14 is movably coupled to the expansion member 12, and is movable (e.g., without limitation, in the direction of arrow 200 in FIGS. 1 and 4) between an actuated position (shown in hidden line drawing in FIG. 4) and an unactuated position (shown in FIGS. 1-3). As will be described in greater detail hereinbelow, the actuated position (FIG. 4) corresponds to the expansion member 12 being expanded outwardly within the recess 112 to secure the mounting assembly 2 to the circuit breaker 100, as partially shown in phantom line drawing in FIG. 4, whereas the unactuated position of FIGS. 1-3 corresponds to the expansion member 12 not being expanded such that the mounting assembly 2 can be readily removed from the circuit breaker 100. In this manner, the disclosed mounting assembly 2 provides a relatively simple and unique mechanism for mounting any known or suitable accessory to the circuit breaker 100, without undesirably requiring the circuit breaker 100 and the breaker door 122 to be opened, potentially exposing personnel to dangerous, energized electrical equipment. For example, in accordance with one non-limiting embodiment of the disclosed concept, which will be described in greater detail hereinbelow, the mounting assembly 2 provides a mechanism for suitably mounting a number of components 300,302 of a remote operating apparatus 400 (shown in simplified form in FIG. 1) in a predetermined position or configuration with respect to the circuit breaker 100 and, in particular, the housing 102 thereof.

The bracket assembly 4 of the example mounting assembly 2 includes a retaining plate 6 having first and second opposing sides 16,18. The first side 16 faces the exterior 104 of the circuit breaker housing 102 and receives the aforementioned expansion member, which in the example shown and described herein is a suitable resilient element 12 (e.g., without limitation, rubber block). The actuator 14 includes a lever assembly 20, which is substantially disposed on the second side 18 of the retaining plate 6, a number of generally planar members or plates 22,24,26 (all shown in FIG. 2) and a number of fasteners 28,30 (best shown in FIG. 2). The resilient element or rubber block 12 is disposed between a corresponding one of the generally planar members 22 and 24. More specifically, as best shown in FIG. 2, the rubber block 12 includes a first side 34, a second side 36 disposed opposite and distal from the first side 34, and a number of apertures 38,40. The first plate member 22 is disposed on the first side 34 of the rubber block 12 and a second plate member 24 is disposed on the second side 36. The non-limiting example embodiment also includes a third plate member 26, as shown, although it will be appreciated that any known or suitable alternative number, configuration and/or type of actuating elements (not shown) could be employed, without departing from the scope of the disclosed concept. Each of the fasteners 28,30 extends through (or alternatively is received within a threaded shaft of a portion of the lever assembly 20 which extends through) one or more of the first plate member 22, a corresponding one of the apertures 38,40 of the rubber block 12, the second plate member 24, and the retaining plate 6 of the bracket assembly 4, in order to fasten the first plate member 22, the rubber block 12, and the second plate member 24 to the lever assembly 20.

The lever assembly 20 includes a handle 32, which is movable between a first position (FIGS. 1-3), corresponding to the actuator 14 being disposed in the aforementioned unactuated position (FIGS. 1-3), and a second position (shown in phantom line drawing in FIG. 4), corresponding to the actuator 14 being disposed in the aforementioned actuated position (FIG. 4). It will be appreciated, therefore, that when the handle 32 is moved from the first position (FIGS. 1-3) to the second position (FIG. 4), the corresponding one of the generally planar members (e.g., without limitation, first plate member 22) moves toward the first side 16 of the retaining plate 6. As it does so, the rubber block 12 is compressed between the first plate member 22 and the retaining plate 6, causing the rubber block 12 to expand outwardly, as generally shown in phantom line drawing in FIG. 4. It is this outward expansion that causes the rubber block 12 to engage the circuit breaker housing 102 at or about the recess 112 thereof, resulting in an interference fit between the rubber block or other suitable resilient element 12 and the interior surface of the recess 112. Accordingly, an effective mounting assembly 2 is provided, without requiring the circuit breaker door 122 to be opened and/or modification of the circuit breaker 100, for example to accommodate various mounting hardware (not shown).

In addition, as best shown in FIGS. 2 and 3, the retaining plate 6 of the example mounting assembly 2 further includes a first bracing portion 42, which extends perpendicularly outwardly from the first side 16 of the retaining plate 6, and a second bracing portion 44, which extends perpendicularly outwardly from the first side 16 of the retaining plate 6 opposite and distal from the first bracing portion 42. When the mounting assembly 2 is secured to the circuit breaker 100, as previously discussed hereinabove, the first bracing portion 42 overlaps a first edge 116 of the exterior 104 of the circuit breaker housing 102, and the second bracing portion 44 overlaps a second edge 116 of the exterior 104 of the circuit breaker housing 102, thereby further bracing (e.g., securing) the mounting assembly 2 in a predetermined position with respect to the circuit breaker 100. By way of example, the mounted position of the mounting assembly 2 on circuit breaker 100 is partially shown in simplified form in the side elevation view of FIG. 4.

It will be appreciated that the mounting assembly 2 may have any known or suitable alternative number, configuration and/or type of brackets or other suitable mounting elements (not shown) other than those which are shown and described herein. It will further be appreciated that each such bracket or mounting element (e.g., without limitation, retaining plate 6; mount 8; accessory housing 10) can be suitably structured to accommodate a wide variety of different features, accessories and/or components. For example and without limitation, the example retaining plate 6 further includes a maneuvering handle 46, which is suitably coupled to the second side 18 of the retaining plate 6 to facilitate, transport and/or positioning of the mounting assembly 2 with respect to the circuit breaker 100 or other suitable apparatus (not shown) to which it is intended to be mounted.

As previously discussed, the actuator 14 of the example mounting assembly 2 includes an actuating handle 32, which is disposed on the second side 18 of the retaining plate 6. The example bracket assembly 4 of the mounting assembly 2 further includes a mount 8, which is also disposed on the second side 18 of the retaining plate 6 at or about the actuating handle 32. Specifically, the mount 8 shown and described herein, includes first and second walls 48,50. The first wall 48 extends perpendicularly outwardly from the second side 18 of the retaining plate 6, and the second wall 50 extends perpendicularly outwardly from the second side 18 of the retaining plate 6 opposite and distal from the first wall 48. The actuating handle 32 is disposed between the first and second walls 48,50, as shown in FIGS. 1-3.

The mount 8 further includes a planar portion 52, which extends between the first and second walls 48,50. A third bracket or accessory housing 10 of the bracket assembly 4 is coupled to the planar portion 52 of the mount 8, and is structured to mount an accessory (e.g., without limitation, 300, 302) in a predetermined position with respect to the circuit breaker 100. Specifically, as previously indicated, in one non-limiting embodiment, the mounting assembly 2 may be used to mount a number of components 300,302 of the aforementioned remote operating apparatus 400 (FIG. 1). Specifically, the circuit breaker housing 102 includes a cover 118 extending between the first and second edges 114,116 thereof. It will be appreciated that the cover 118 may include an operating coupling (indicated generally in FIGS. 1, 2 and 4 by reference 120). In this manner, the mounting assembly 2 and, in particular, the accessory housing 10 thereof, serve to mount component(s) 300,302 in a predetermined position with respect to the circuit breaker 100. This enables the remote operating apparatus 400 to operate the circuit breaker 100 remotely, without requiring the door 122 accessing the circuit breaker 100 to be opened.

In the example shown and described herein, the remote operating apparatus component(s) include a drive mechanism 300 (e.g., without limitation, electric motor) and an interface shaft 302. The interface shaft 302 includes first and second opposing ends 304,306. Specifically, as shown in simplified form in FIG. 4, the interface shaft 302 interconnects the operating coupling 120 (shown in simplified form in phantom line drawing) of the circuit breaker 100 (partially shown in simplified form in phantom line drawing) and the drive mechanism or motor 300. That is, the first end 304 of the interface shaft 302 operatively engages the operating coupling 120, and the second end 306 of the interface shaft 302 operatively engages the drive mechanism or motor 300. Thus, the circuit breaker 100 can be operated remotely via the motor 300, interface shaft 302 and operating coupling 120. Among other benefits, this enables personnel to operate (e.g., without limitation, rack in; rack out) the circuit breaker 100 from a safe distance, avoiding the potential for exposure to harmful energized electronic equipment. In addition, the mounting assembly 2 enables the remote operating apparatus 400 (FIG. 1) to be suitably mounted with respect to the circuit breaker 100 and, in particular, the operating coupling 120 thereof, without requiring any modification to the circuit breaker 100 and without requiring the door 122 accessing the circuit beaker 102 to be opened, thereby further improving safety.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A mounting assembly for an electrical switching apparatus, said electrical switching apparatus comprising a housing having an exterior and an interior, separable contacts disposed in the interior, and an operating mechanism structured to open and closed said separable contacts, the exterior of said housing comprising a recess, said mounting assembly comprising:

a bracket assembly including at least one bracket;

an expansion member coupled to a corresponding one of said at least one bracket and being structured to be disposed within said recess on the exterior of said housing; and an actuator movably coupled to said expansion member, said actuator being movable between an actuated position corresponding to said expansion member being structured to expand outwardly within said recess to secure said mounting assembly to said electrical switching apparatus, and an unactuated position corresponding to said expansion member not being expanded and said mounting assembly being removable from said electrical switching apparatus;

wherein said corresponding one of said at least one bracket comprises a retaining plate;

wherein said retaining plate includes a first side structured to face the exterior of the housing, and a second side disposed opposite the first side;

wherein said expansion member comprises a resilient element; and wherein said actuator comprises a lever assembly, a number of generally planar members, and a number of fasteners fastening said resilient element and said generally planar members to said lever assembly.

2. The mounting assembly of claim 1 wherein said lever assembly is substantially disposed on the second side of said retaining plate; and wherein said resilient element is disposed between a corresponding one of said generally planar members and the first side of said retaining plate.

3. The mounting assembly of claim 2 wherein said lever assembly includes a handle; wherein said handle is movable between a first position corresponding to said actuator being disposed in said unactuated position, and a second position corresponding to said actuator being disposed in said actuated position; and wherein, when said handle is moved from said first position toward said second position, said corresponding one of said generally planar members moves toward the first side of said retaining plate, thereby compressing said resilient element therebetween and causing said resilient element to expand outwardly.

4. The mounting assembly of claim 1 wherein said resilient element is a rubber block; wherein said rubber block includes a first side, a second side disposed opposite and distal from the first side of said rubber block, and a number apertures; wherein said number of generally planar members is a first plate member disposed on the first side of said rubber block and a second plate member disposed on the second side of said rubber block; and wherein each of said number of fasteners extends through said first plate member, through a corresponding one of said apertures of said rubber block, through said second plate member, and through said retaining plate of said bracket assembly to fasten said first plate member, said rubber block, and said second plate member to said lever assembly.

5. The mounting assembly of claim 1 wherein the exterior of said housing further comprises a first edge, a second edge disposed opposite and distal from the first edge, and a cover extending between the first edge and the second edge; wherein said recess is disposed on said cover; wherein said retaining plate further comprises a first bracing portion extending perpendicularly outwardly from the first side of said retaining plate and a second bracing portion extending perpendicularly outwardly from the first side of said retaining plate opposite and distal from said first bracing portion; and wherein, when said mounting assembly is secured to said electrical switching apparatus, said first bracing portion is structured to overlap the first edge of the exterior of said housing and said second bracing portion is structured to overlap the second edge of the exterior of said housing, thereby bracing said mounting assembly in a predetermined position with respect to said electrical switching apparatus.

6. The mounting assembly of claim 1 wherein said retaining plate further comprises a maneuvering handle; and wherein said maneuvering handle is disposed on the second side of said retaining plate.

7. The mounting assembly of claim 1 wherein said at least one bracket of said bracket assembly comprises a retaining plate and a mount; wherein said retaining plate includes a first side structured to face the exterior of said housing, and a second side disposed opposite the first side; wherein said actuator comprises an actuating handle; wherein said actuating handle is disposed on the second side of said retaining plate; and wherein said mount is coupled to the second side of said retaining plate at or about said actuating handle.

8. The mounting assembly of claim 7 wherein said mount comprises a first wall and a second wall; wherein said first wall extends perpendicularly outwardly from the second side of said retaining plate; wherein said second wall extends perpendicularly outwardly from the second side of said retaining plate opposite and distal from said first wall; and wherein said actuating handle is disposed between said first wall and said second wall.

9. The mounting assembly of claim 7 wherein said mount further comprises a planar portion; wherein said planar portion extends between said first wall and said second wall; wherein said bracket assembly further comprises an accessory housing; wherein said accessory housing is coupled to the planar portion of said mount; and wherein said accessory housing is structured to mount an accessory in a predetermined position with respect to said electrical switching apparatus.

10. The mounting assembly of claim 9 wherein said housing of said electrical switching apparatus further comprises a cover; wherein said electrical switching apparatus further comprises a remote operating apparatus; wherein said accessory is a number of components for said remote operating apparatus; and wherein said accessory housing mounts said components in a predetermined position with respect to said electrical switching apparatus to enable said remote operating apparatus to operate said electrical switching apparatus remotely, without requiring said cover of said electrical switching apparatus to be opened.

11. An electrical switching apparatus comprising:

a housing having an exterior and an interior, the exterior of said housing comprising a recess;

separable contacts disposed in the interior;

an operating mechanism structured to open and closed said separable contacts;

a mounting assembly comprising:

a bracket assembly including at least one bracket, an expansion member coupled to a corresponding one of said at least one bracket, the expansion member being disposed within said recess on the exterior of said housing;

an actuator movably coupled to said expansion member, said actuator being movable between an actuated position corresponding to said expansion member being expanded outwardly within said recess to secure said mounting assembly to said electrical switching apparatus, and an unactuated position corresponding to said expansion member not being expanded and said mounting assembly being removable from said electrical switching apparatus wherein said corresponding one of said at least one bracket comprises a retaining plate;

wherein said retaining plate includes a first side structured to face the exterior of the housing, and a second side disposed opposite the first side;

wherein said expansion member comprises a resilient element; and wherein said actuator comprises a lever assembly, a number of generally planar members, and a number of fasteners fastening said resilient element and said generally planar members to said lever assembly.

12. The electrical switching apparatus of claim 11 wherein said lever assembly is substantially disposed on the second side of said retaining plate; wherein said resilient element is disposed between a corresponding one of said generally planar members and the first side of said retaining plate; wherein said lever assembly includes a handle; wherein said handle is movable between a first position corresponding to said actuator being disposed in said unactuated position, and a second position corresponding to said actuator being disposed in said actuated position; and wherein, when said handle is moved from said first position toward said second position, said corresponding one of said generally planar members moves toward the first side of said retaining plate, thereby compressing said resilient element therebetween and causing said resilient element to expand outwardly.

13. The electrical switching apparatus of claim 11 wherein the exterior of said housing further comprises a first edge, a second edge disposed opposite and distal from the first edge, and a cover extending between the first edge and the second edge; wherein said recess is disposed on said cover; wherein said retaining plate further comprises a first bracing portion extending perpendicularly outwardly from the first side of said retaining plate and a second bracing portion extending perpendicularly outwardly from the first side of said retaining plate opposite and distal from said first bracing portion; and wherein, when said mounting assembly is secured to said electrical switching apparatus, said first bracing portion overlaps the first edge of the exterior of said housing and said second bracing portion overlaps the second edge of the exterior of said housing, thereby bracing said mounting assembly in a predetermined position with respect to said electrical switching apparatus.

14. The electrical switching apparatus of claim 11 wherein said at least one bracket of said bracket assembly comprises a retaining plate and a mount; wherein said retaining plate includes a first side structured to face the exterior of said housing, and a second side disposed opposite the first side; wherein said actuator comprises an actuating handle; wherein said actuating handle is disposed on the second side of said retaining plate; and wherein said mount is coupled to the second side of said retaining plate at or about said actuating handle.

15. The electrical switching apparatus of claim 14 wherein said mount comprises a first wall and a second wall; wherein said first wall extends perpendicularly outwardly from the second side of said retaining plate; wherein said second wall extends perpendicularly outwardly from the second side of said retaining plate opposite and distal from said first wall; and wherein said actuating handle is disposed between said first wall and said second wall.

16. The electrical switching apparatus of claim 15 wherein said mount further comprises a planar portion; wherein said planar portion extends between said first wall and said second wall; wherein said bracket assembly further comprises an accessory housing; wherein said accessory housing is coupled to the planar portion of said mount; and wherein said accessory housing mounts an accessory in a predetermined position with respect to said electrical switching apparatus.

17. The electrical switching apparatus of claim 16 wherein said electrical switching apparatus further comprises a remote operating apparatus; wherein said accessory is a number of components for said remote operating apparatus; and wherein said accessory housing mounts said components in a predetermined position with respect to said electrical switching apparatus.

18. The electrical switching apparatus of claim 17 wherein said electrical switching apparatus is a circuit breaker; wherein said circuit breaker further comprises an operating coupling; wherein the exterior of said housing of said circuit breaker further comprises a cover; wherein said operating coupling is disposed on said cover; wherein said number of components comprises a drive mechanism and an interface shaft; wherein said interface shaft includes a first end structured to be coupled to said operating coupling, and a second end being operatively coupled to said drive mechanism; and wherein said accessory housing mounts said drive mechanism and said interface shaft in a predetermine position with respect to said circuit breaker, thereby enabling said remote operating apparatus to operate said circuit breaker remotely, without requiring said cover of said circuit breaker to be opened.

* * * * *